(12) United States Patent
Huang et al.

(10) Patent No.: US 6,343,015 B1
(45) Date of Patent: Jan. 29, 2002

(54) HEAT SINK CLIP

(75) Inventors: Aimin Huang, ShenZhen (CN); Carey Lai, Tu-Chen (TW)

(73) Assignee: Foxconn Precision Components Co., Ltd., Taipei Hsien (TW)

(*) Notice: Subject to any disclaimer, the term of this patent is extended or adjusted under 35 U.S.C. 154(b) by 0 days.

(21) Appl. No.: 09/694,886

(22) Filed: Oct. 23, 2000

(30) Foreign Application Priority Data

Sep. 1, 2000 (TW) .......................................... 89215209

(51) Int. Cl.$^7$ ................................................ H05K 7/20
(52) U.S. Cl. ........................ 361/704; 24/458; 165/185; 248/510; 257/727
(58) Field of Search ....................... 24/453, 457, 458, 24/473, 570, 573.1, 625; 174/16.3; 165/80.3, 185; 439/485; 248/316.7, 500, 505, 510; 267/150, 158, 160; 257/717, 719, 722, 727; 361/703, 704, 710, 711, 717–719, 722

(56) References Cited

U.S. PATENT DOCUMENTS

| | | | |
|---|---|---|---|
| 5,600,540 A | * | 2/1997 | Blomquist .................. 361/704 |
| 5,634,480 A | * | 6/1997 | Lu .............................. 132/275 |
| 5,660,562 A | * | 8/1997 | Lin ............................. 439/487 |
| 5,933,325 A | * | 8/1999 | Hou ............................ 361/704 |
| 6,025,994 A | * | 2/2000 | Chiou ......................... 361/715 |
| 6,108,207 A | * | 8/2000 | Lee | |
| 6,118,661 A | * | 9/2000 | Lo ............................. 361/704 |
| 6,208,518 B1 | * | 3/2001 | Lee ............................. 361/704 |
| 6,229,705 B1 | * | 5/2001 | Lee ............................. 361/704 |

* cited by examiner

Primary Examiner—Gerald Tolin
(74) Attorney, Agent, or Firm—Wei Te Chung

(57) ABSTRACT

A heat sink clip (10) includes a body (12), and first and second arms (13, 19) depending from opposite ends of the body. The body includes a curved portion (11), first and second spring portions (15, 17) extending from opposite ends of the curved portion, and a connecting portion (16) between the second spring portion and the second arm. Each arm defines aperture (14). A fin (24) with a hole (25) defined therein is stamped outwardly from the second arm above the aperture, for engaging with a tool. Two flanges (27) extend upwardly from respective opposite longitudinal edges of the curved portion, thereby reinforcing the curved portion. Two longitudinal ribs (29) are formed at respective opposite sides of the curved portion, thereby reinforcing the body.

8 Claims, 5 Drawing Sheets

HEAT SINK CLIP

BACKGROUND

1. Field of the Invention

The present invention relates to a clip, and particularly to a clipwhich resists deformation and thereby securely attaches a heat sink to an electronic device.

2. The Related Art

Many electronic devices such as Central Processing Units (CPUs) generate large amounts of heat during operation. This can deteriorate the operational stability of such devices. To overcome this problem, a heat sink is conventionally mounted to a CPU for removing heat therefrom. Various clips have been used for attaching a heat sink to a CPU.

Referring to FIG. 6, a conventional clip 1 comprises a pressing body 2 and two arms 3 depending from opposite ends of the pressing body 2. Each arm 3 defines lower and upper apertures 4, 5. The lower apertures 4 engage with corresponding tabs formed on a socket on which a CPU is mounted, for attaching a heat sink to the CPU. The upper apertures 5 receive a tool such as a screwdriver, to enable the lower apertures 4 to be engaged or disengaged. However, this kind of clip has low bending strength. Thus the heat sink cannot be firmly attached to the CPU, thereby reducing the effectiveness of heat removal.

Furthermore, repeated installation and removal of the clip results in elastic fatigue and excessive deformation occurring at its bending points. This results in unduly loose contact between the heat sink and the CPU. Thus the effectiveness of heat removal is again reduced.

SUMMARY OF THE INVENTION

Accordingly, an object of the present invention is to provide a clip which has high bending strength to ensure firm attachment between a heat sink and an electronic device.

A further object of the present invention is to provide a heat sink clip which is durable.

To achieve the above-mentioned objects, a heat sink clip comprises a body, and first and second arms depending from opposite ends of the body. The body comprises a curved portion, first and second spring portions extending from opposite ends of the curved portion, and a connecting portion between the second spring portion and the second arm. Each arm defines an aperture therethrough. A fin with a hole defined therethrough is stamped outwardly from the second arm above the aperture, for engaging with a tool. Two flanges extend upwardly from respective opposite longitudinal edges of the curved portion, thereby reinforcing the curved portion. Two longitudinal ribs are formed at respective opposite sides of the curved portion, thereby reinforcing the body.

Other objects, advantages and novel features of the present invention will be drawn from the following detailed embodiments of the present invention with attached drawings, in which:

DESCRIPTION OF THE PREFERRED EMBODIMENTS

Figure 1:
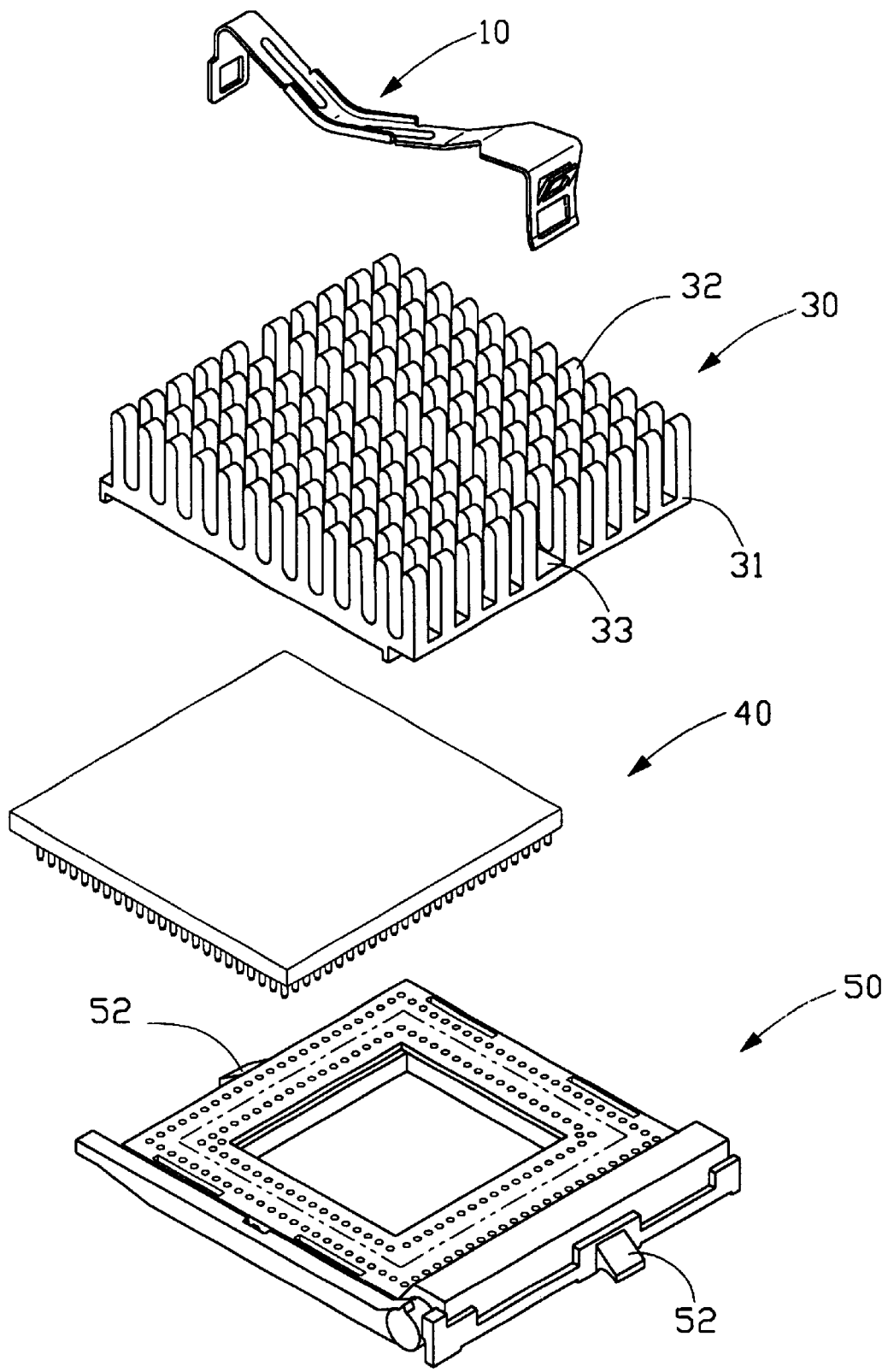
FIG. 1 is an exploded view showing a heat sink clip in accordance with a preferred embodiment of the present invention, for attaching a heat sink to a CPU mounted on a socket.

Referring to FIG. 1, a clip 10 is a preferred embodiment of the present invention. A conventional heat sink 30 includes a base 31 and a plurality of fins 32 extending upwardly from a top surface of the base 31. A slot 33 is defined at the center of the base 31 for receiving the clip 10. The heat sink 30 is typically attached to a central processing unit (CPU) 40. The CPU 40 is mounted on a conventional socket 50. The socket 50 has a pair of external tabs 52 at respective opposite sides thereof.

Figure 2:
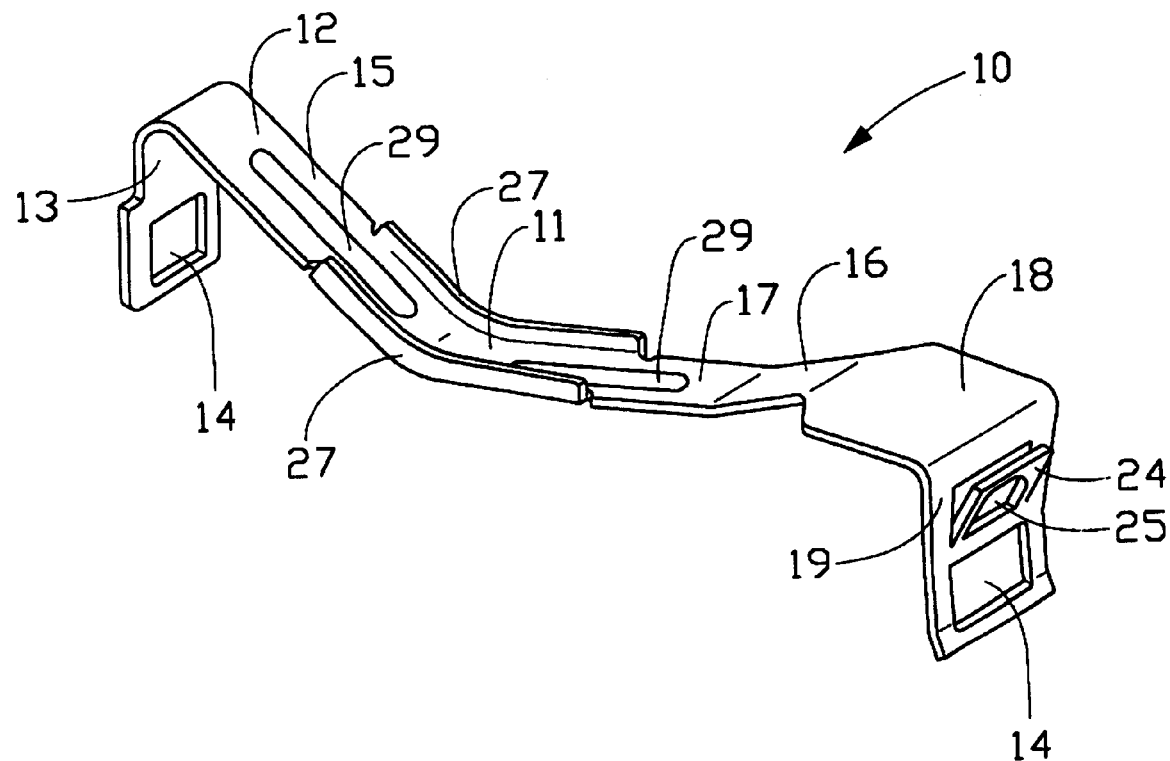
FIG. 2 is a perspective view of the clip of FIG. 1.

Referring to FIG. 2, the clip 10 includes a body 12, and first and second arms 13, 19 depending from opposite ends of the body 12. The body 12 includes a curved portion 11, first and second spring portions 15, 17, a connecting portion 16, and a widened handle portion 18. The first and second spring portions 15, 17 extend from opposite ends of the curved portion 11. The connecting portion 16 extends from an outer end of the second spring portion 17. The handle portion 18 extends from an outer end of the connecting portion 16, and is for facilitating operation. The first arm 13 depends from a free end of the first spring portion 15. The second arm 19 depends from a free end of the handle portion 18. Each arm 13, 19 defines an aperture 14 therethrough. A fin 24 is stamped outwardly from the second arm 19, above the aperture 14. The fin 24 defines a hole 25 therethrough. Two flanges 27 extend upwardly from respective opposite longitudinal edges of the curved portion 11, for reinforcing the curved portion 11. Two longitudinal ribs 29 are formed at respective opposite sides of the curved portion 11, for reinforcing the body 12.

Figure 3:
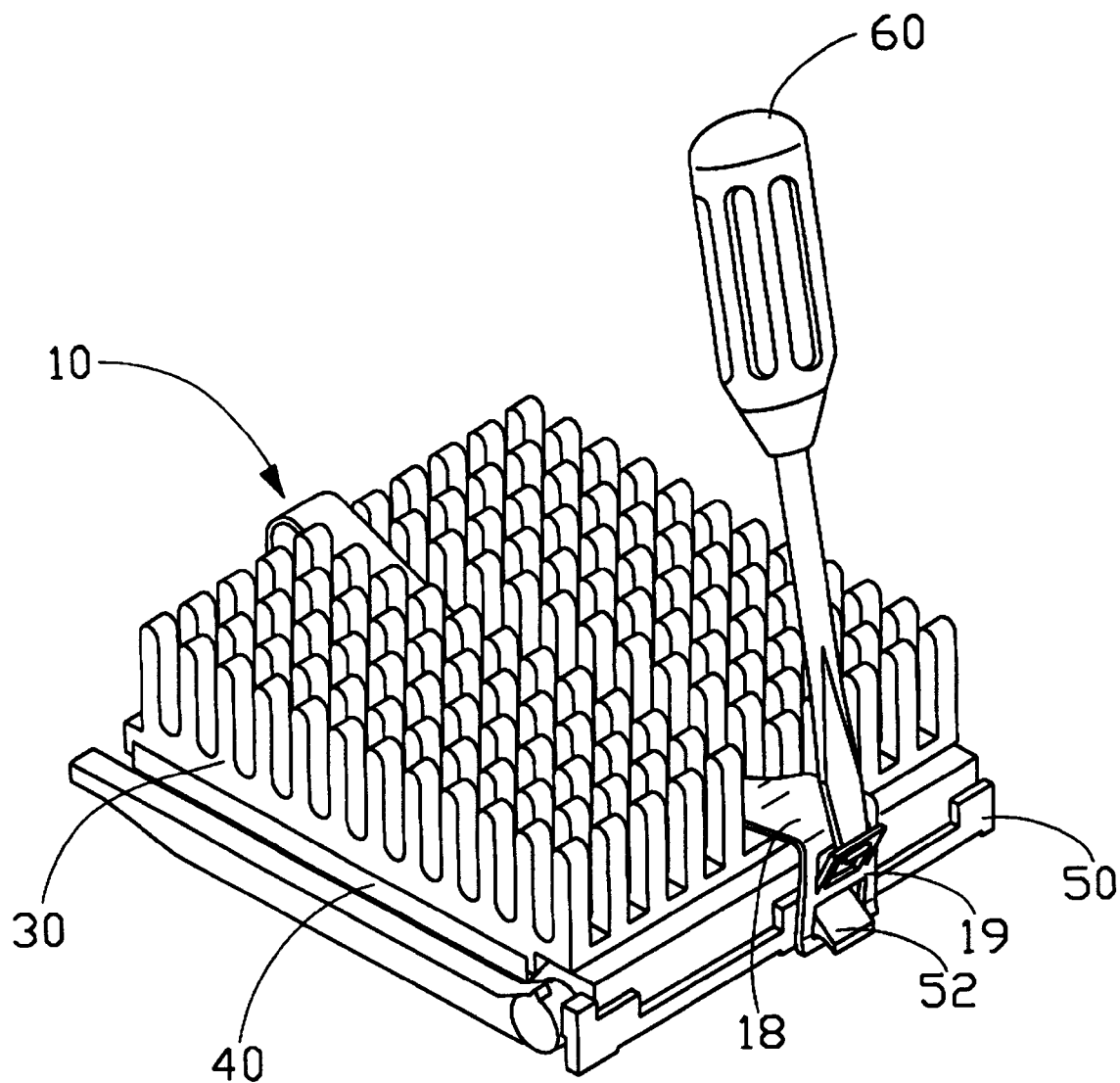
FIG. 3 is an assembled view of FIG. 1, also showing a tool used in disassembly.

Also referring to FIG. 3, in assembly, the heat sink 30 is placed onto a top surface of the CPU 40 mounted on the socket 50. The clip 10 is placed in the slot 33 of the heat sink 30. The aperture 14 of the first arm 13 is engaged with the corresponding tab 52 of the socket 50. The handle portion 18 is then depressed to cause the aperture 14 of the second arm 19 to engage with the other tab 52 of the socket 50. The heat sink 30 is thereby firmly attached to the CPU 40.

In disassembly, a tool 60 such as a screwdriver is engaged with the hole 25 of the fin 24 of the clip 10. The tool 60 urges the second arm 19 to move outwardly, thereby releasing the aperture 14 of the second arm 19 from the corresponding tab 52 of the socket 50. The aperture 14 of the first arm 13 is then readily detached from the other tab 52 of the socket 50. Thus the heat sink 30 is readily detached from the CPU 40.

In assembly, disassembly, and during use of the clip 10, elastic deformation is transferred from the curved portion 11 to the flanges 27 and the longitudinal ribs 29. This prevents the curved portion 11 from being subjected to excessive deformation and elastic fatigue. Thus the clip 10 possesses superior bending strength and durability.

Figure 4:
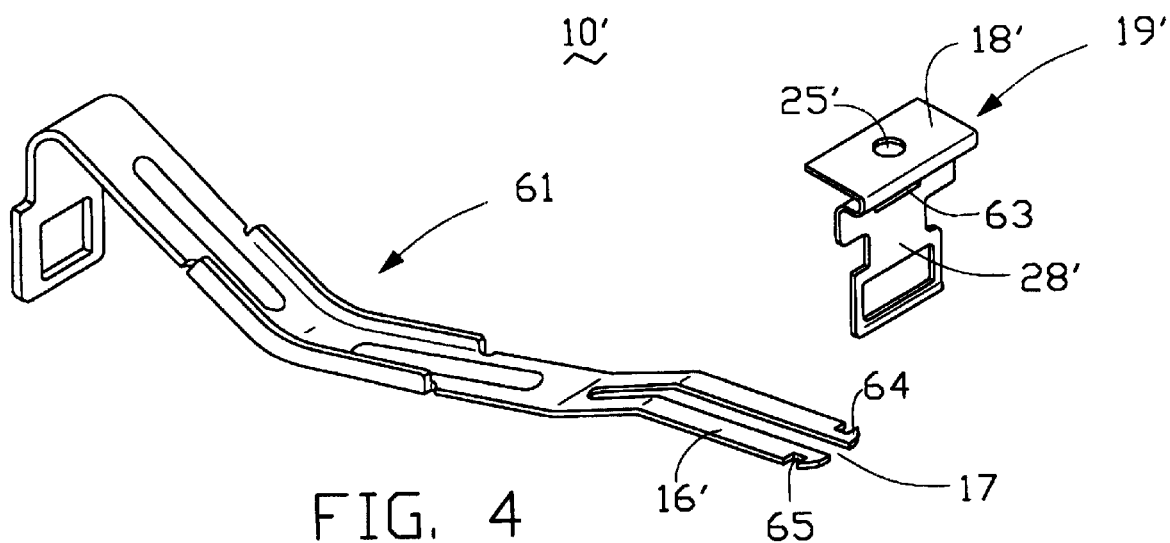
FIG. 4 is an exploded view of a heat sink clip in accordance with an alternative embodiment of the present invention.
Figure 5:
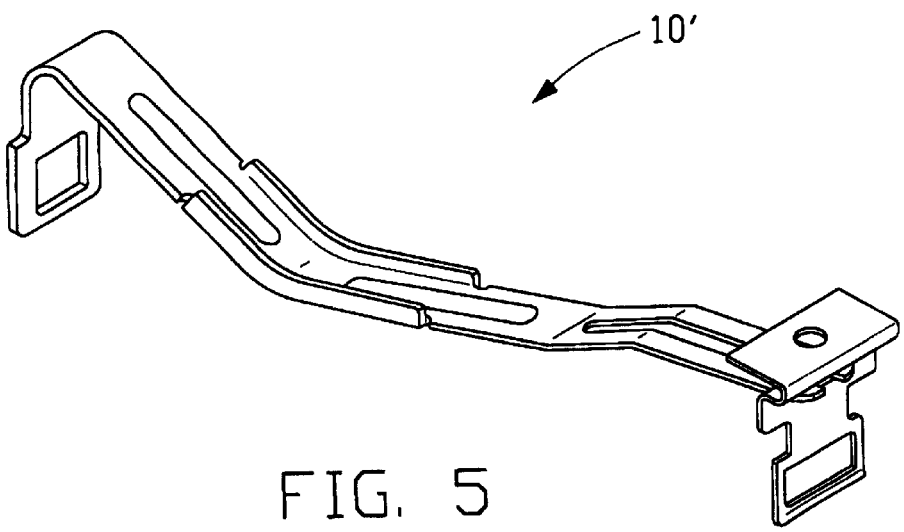
FIG. 5 is an assembled view of FIG. 4.
Figure 6:
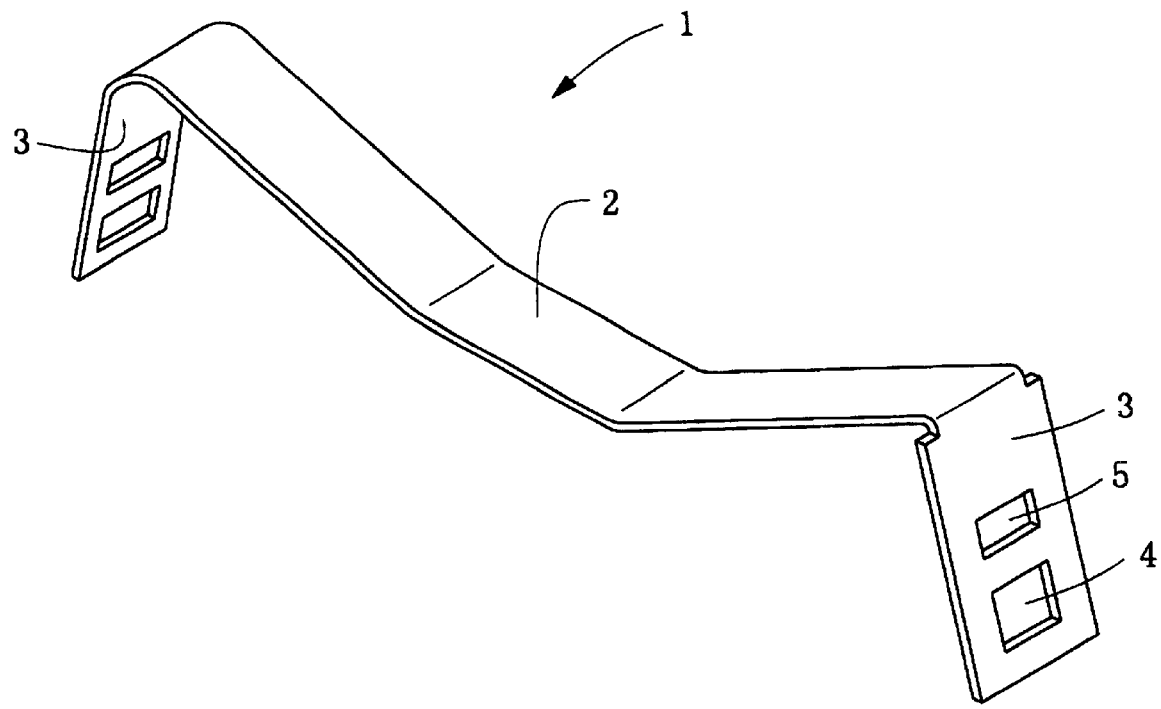
FIG. 6 is a perspective view of a conventional heat sink clip.

FIGS. 4 and 5 show a heat sink clip 10' in accordance with an alternative embodiment of the present invention. The clip 10' includes a body 61 and a separable second arm 19'. The body 61 includes a connecting portion 16'. The connecting portion 16' defines a central longitudinal slot 17 therethrough, for providing deformation space. A pair of cutouts 65 is defined in respective opposite outer edges of the connecting portion 16', near a free end of the connecting portion 16'. A pair of barbs 64 is accordingly formed at respective opposite outer edges of the connecting portion 16', at the free end of the connecting portion 16'. The second arm 19' includes a horizontal handle portion 18' at a top end thereof, and a vertical plate 28' depending from the handle portion 18'. A hole 25' is defined in the handle portion 18', for engaging with a tool (not shown). An aperture 63 is defined in the plate 28', for extension of the barbs 64 of the body 61 therethrough. The second arm 19' is thereby connected to the body 61 to form the clip 10'.

It is understood that the invention may be embodied in other forms without departing from the spirit thereof. Thus, the present examples and embodiments are to be considered in all respects illustrative and not restrictive, and the invention is not to be limited to the details given herein.

What is claimed is:

1. A heat sink clip comprising:

a body comprising a curved portion adapted for pressing a heat sink to an electronic device, at least two flanges extending upwardly at respective opposite edges of the curved portion for reinforcing the curved portion, and at least two ribs formed at respective opposite sides of the curved portion for reinforcing the body;

a first arm depending from an end of the body adapted for engaging with a socket; and a second arm depending from an opposite end of the body adapted for engaging with the socket.

2. The heat sink clip as described in claim 1, wherein the body further comprises a handle portion for facilitating operation, and wherein the second arm depends from the handle portion.

3. The heat sink clip as described in claim 1, wherein a fin is formed outwardly from the second arm, and wherein a hole is defined in the fin for receiving a tool.

4. The heat sink clip as described in claim 1, wherein the second arm comprises a handle portion at a top end thereof.

5. The heat sink clip as described in claim 4, wherein a hole is defined in the handle portion of the second arm for receiving a tool.

6. The heat sink clip as described in claim 4, wherein the body further comprises a connecting portion which defines a pair of cutouts to form a pair of barbs at a free end of the connecting portion, and wherein the second arm defines an aperture for extension of the barbs therethrough and resultant connection of the second arm to the body.

7. The heat sink clip as described in claim 6, wherein a longitudinal slot is defined in the connecting portion, for allowing the barbs of the connecting portion to elastically move toward each other.

8. A heat sink assembly comprising:

a socket;

a CPU positioned on the socket;

a heat sink positioned on the socket and defining a plurality of fins with a slot defined therein;

a clip including a body received within the slot, said body defining a curved portion abutting against a top surface of the heat sink, a pair of continuous flanges extending upwardly at two opposite respective edges of the curved portion along a lengthwise direction of the clip, and at least two spaced ribs formed at respective opposite sides of the curved portion for enforcing the body, said ribs extending along the lengthwise direction and between said pair of flanges;

a first arm depending from an end of the body and latchably engaged with one side of the socket; and a second arm depending from an opposite end of the body and latchably engaged with the other side of the socket.

* * * * *